(12) United States Patent  
Foster

(10) Patent No.: US 8,987,840 B2
(45) Date of Patent: Mar. 24, 2015

(54) EDGE-MOUNTED SENSOR

(75) Inventor: Michael Foster, Issaquah, WA (US)

(73) Assignee: Honeywell International Inc., Morristown, NJ (US)

( * ) Notice: Subject to any disclaimer, the term of this patent is extended or adjusted under 35 U.S.C. 154(b) by 48 days.

(21) Appl. No.: 13/019,175

(22) Filed: Feb. 1, 2011

(65) Prior Publication Data

US 2012/0193731 A1 Aug. 2, 2012

(51) Int. Cl.
- *H01L 27/14* (2006.01)
- *B81B 7/00* (2006.01)
- *H01L 23/544* (2006.01)

(52) U.S. Cl.
CPC ....... *B81B 7/0074* (2013.01); *H01L 2924/1461* (2013.01); *H01L 23/544* (2013.01)
USPC ........... 257/414; 257/415; 257/417; 257/419; 257/797; 257/E23.179

(58) Field of Classification Search
CPC ...................... H01L 2924/1461; H01L 23/544
USPC ................. 257/414, 415, 417, 418, 419, 797, 257/E23.179; 438/5, 401
See application file for complete search history.

(56) References Cited

U.S. PATENT DOCUMENTS

| | | | |
|---|---|---|---|
| 5,503,016 A | 4/1996 | Koen | |
| 6,391,685 B1 | 5/2002 | Hikita et al. | |
| 6,566,742 B1 * | 5/2003 | Matsumoto et al. | 257/678 |
| 6,841,839 B2 * | 1/2005 | Sridhar et al. | 257/415 |
| 6,949,807 B2 | 9/2005 | Eskridge et al. | |
| 7,253,079 B2 | 8/2007 | Hanson et al. | |
| 2003/0166310 A1 * | 9/2003 | Caplet | 438/50 |
| 2003/0209789 A1 * | 11/2003 | Hanson et al. | 257/678 |
| 2005/0139967 A1 * | 6/2005 | Eskridge et al. | 257/659 |
| 2006/0179942 A1 | 8/2006 | Fukaura et al. | |
| 2006/0192272 A1 * | 8/2006 | Receveur et al. | 257/633 |
| 2007/0099395 A1 * | 5/2007 | Sridhar et al. | 438/460 |
| 2012/0142144 A1 * | 6/2012 | Taheri | 438/107 |

OTHER PUBLICATIONS

European Search Report from counterpart EPC Application No. 12153320.2, dated Dec. 4, 2013, 3 pp.

* cited by examiner

*Primary Examiner* — Benjamin Sandvik
*Assistant Examiner* — Leslie Pilar Cruz
(74) *Attorney, Agent, or Firm* — Shumaker & Sieffert, P.A.

(57) ABSTRACT

Sensor packages and methods for making a sensor device package for side mounting on a circuit board. A sensor device (s) in a mechanical layer of silicon is sandwiched between first and second layers of glass to create a wafer. A first via(s) is created in the first or second layers to expose a predefined area of the mechanical layer of silicon. A second via(s) is created in the first or second layers. The least one second via has a depth dimension that is less than a depth dimension of the first via. A metallic trace is applied between the exposed area on the mechanical layer and a portion of the second via. The wafer is sliced such that the second via is separated into two sections, thereby creating a sensor die. The sensor die is then electrically and mechanically bonded to a circuit board at the sliced second via.

18 Claims, 4 Drawing Sheets

EDGE-MOUNTED SENSOR

BACKGROUND OF THE INVENTION

In order to form a complete triax of accelerometers or gyros where all mechanisms are the same, at least one of the mechanisms must be mounted in a complex custom package or the die must be edge mounted.

Various micromechanical devices, such as micromechanical gyroscopes, require hermetic sealing in order to ensure long-term, accurate operation. Conventional hermetic sealing is achieved by mounting the device in a hermetically-sealed housing or enclosure. Input and output electrical connections to and from the enclosed device are provided by embedding conductors through portions of the enclosure to permit conductive traces or wires to be connected to the device.

However, this type of hermetically-sealed enclosure tends to be relatively costly. Moreover, tolerances associated with mounting the device in the enclosure may affect the accuracy of a device, which is sensitive to spatial orientation. For example, some inertial systems utilize three inertial rate sensors arranged orthogonally with respect to one another. When each such sensor is mounted in a respective hermetically-sealed enclosure, tolerances associated with mounting each sensor in the respective enclosure, as well as tolerances associated with mounting the enclosed packages in orthogonal relationship with respect to each other, may adversely affect the accuracy of the system.

SUMMARY OF THE INVENTION

The present invention provides a method for making a sensor device package for side mounting on a circuit board. In an exemplary method, a sensor device(s) is created in a mechanical layer of silicon that is bonded to a first layer of glass. A second layer of glass is attached to the mechanical layer of silicon to create a wafer. A first via(s) is created in the first and/or second layers of glass to expose a predefined area on a surface of the mechanical layer of silicon. A second via(s) is created in the first and/or second layers of glass. The least one second via has a depth dimension that is less than a depth dimension of the first via. A metallic trace is applied between the exposed area on the mechanical layer of silicon and a portion of the second via. The wafer is sliced such that the second via is separated into two sections, thereby creating a sensor die. The sensor die is then electrically and mechanically bonded to a circuit board at the sliced second via.

In one aspect of the invention, the sensor device is hermetically sealed between the first or second layers of glass.

In another aspect of the invention, the sensor device is an accelerometer.

In still another aspect of the invention, two other sensor dies are attached to the circuit board such that sense axes of the other sensor dies are perpendicular to a sense axis of the first sensor die.

BRIEF DESCRIPTION OF THE DRAWINGS

Preferred and alternative embodiments of the present invention are described in detail below with reference to the following drawings:

FIGS. 2-1 through 2-3 are side, cross-sectional views of steps for manufacturing a device, such as that shown in FIG. 1;

FIG. 3 illustrates a perspective view of a die formed in accordance with an embodiment of the present invention and FIG. 4 illustrates a top down view of a three-axis sensing device formed in accordance with an embodiment of the present invention.

DETAILED DESCRIPTION OF THE INVENTION

Figure 1:
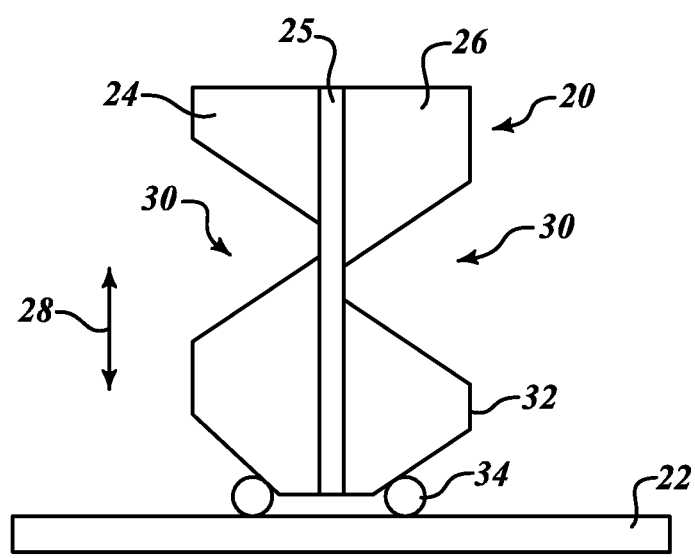
FIG. 1 illustrates a side, cross-sectional view of a die mounted to a circuit board in accordance with an embodiment of the present invention.

FIG. 1 illustrates an example of a die 20 mounted vertically to a circuit board 22. The die 20 includes a mechanical layer 25 having at least one microelectromechanical systems (MEMS) device (i.e., sensor). In this example, the mechanical layer 25 includes an accelerometer configured to sense motion in a vertical plane (arrow 28) (i.e., perpendicular to the circuit board 22).

Figure 4:
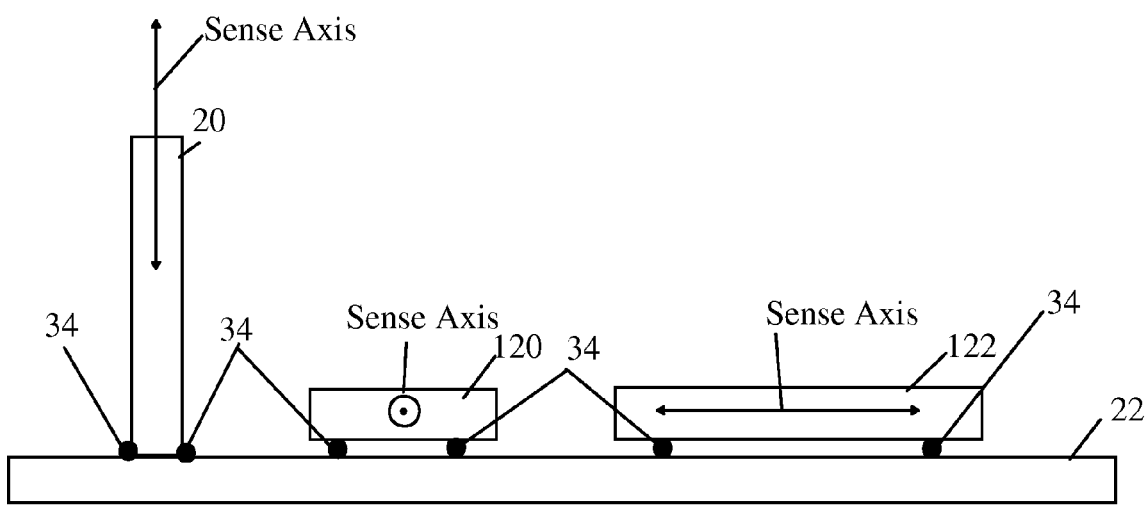

Two accelerometers identical to that packaged in the mechanical layer 25 of the die 20 may be packaged into other dies 120, 122 and mounted orthogonally to the die 20 in a conventional manner. Also, the sense axes for the two alternate accelerometer die packages are orthogonal to each other, thereby providing a device that includes three identical in-plane accelerometers that will sense acceleration in three orthogonal axes. (See FIG. 4). Metallic beads 34 mechanically and electrically bond the first, second, and third dies 20, 120, 122 to the circuit board 22 such that sense axes for each of the sensor devices are perpendicular.

The die 20 is attached mechanically and electrically to the circuit board 22 by electrically conductive beads 34 that attach to traces 32 located on angled portions of top or bottom surfaces of handle layers 24, 26 (e.g., glass) that are located on opposing sides of the mechanical layer 25 (i.e., silicon). Vias 30 are formed in the respective glass handle layer 26 or 24 for exposing portions of the mechanical layer 25. The portion of the exposed mechanical layer 25 includes an electrical trace that connects to an active component located within the mechanical layer 25. The trace 32 connects the electrical bead 34 (e.g., gold) with the electrical lead located on the mechanical layer 25 at the exposed surface.

Figures 1, 2:
Figure 2:
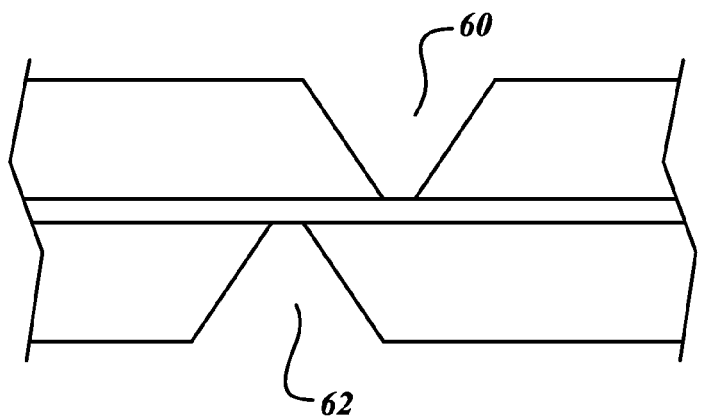

FIG. 2-1 illustrates a wafer 50 that includes a previously machined silicon layer 52 that includes one or more active devices, such as accelerometers or gyros. The machined silicon layer 52 is attached to a base layer of glass 56 before creation of the active devices. A cover layer of glass 54 is bonded to the machined silicon layer 52 after creation of the active devices. The cover layer of glass 54 provides a hermetic seal of the active devices.

FIG. 2-2 shows the results of two separately performed processes, whereby vias 60 and 62 are formed within the glass layers 54, 56, respectively. The vias 60, 62 are formed using standard glass-etching techniques. The vias 60, 62 expose sections of the silicon layer 52 for exposing electrical leads (not shown) that are connected to the active components located within the silicon layer 52 for providing access to signals associated with the active component. The vias 60, 62 do not compromise the hermetic seal.

Figures 2, 3:
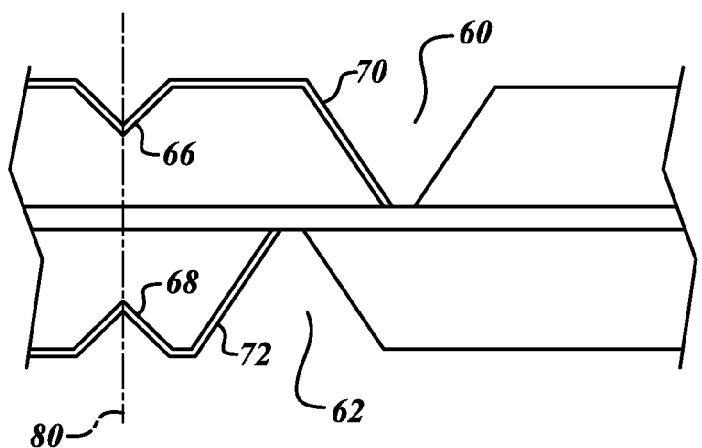
Figure 3:
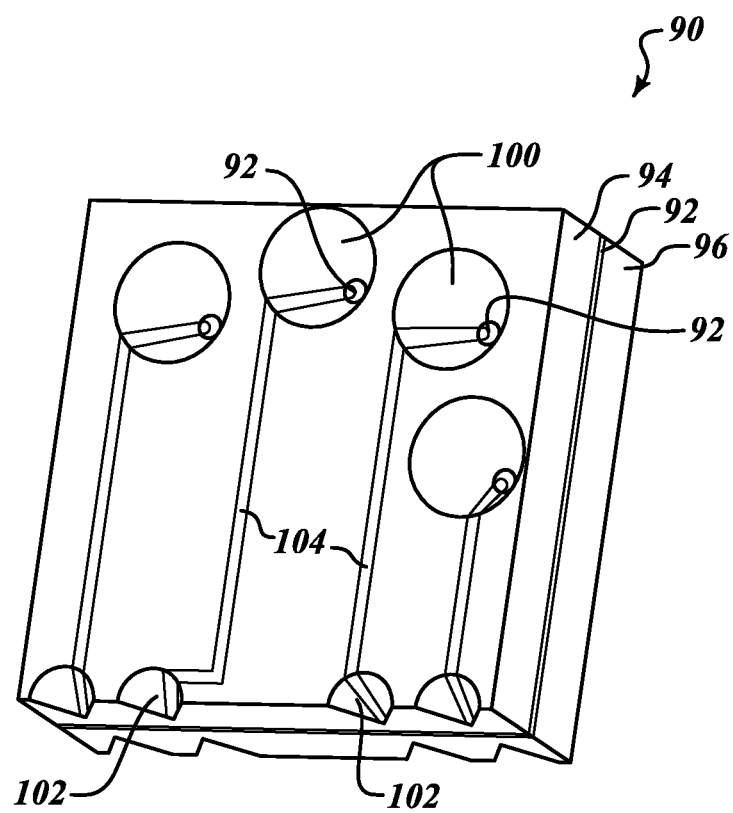

FIG. 2-3 shows that second vias 66 and 68 have been etched into the glass layers 54, 56. The vias 66, 68 do not penetrate all the way to the machined silicon layer 52 and are aligned along a predefined axis 80, such that a base of the vias 66, 68 is located approximately at the axis 80. The axis 80 represents a predefined cut line used for separating the wafer 50 into a plurality of individual sensor units. The vias 66, 68 are performed by two separate processes. Next, also performed by two separate processes, is the application of electrical traces 70, 72 that are applied at least between the bottom of the vias 66, 68 and the surface of the machined silicon layer 52. In one embodiment, a single trace connects a small via to the silicon layer within a large via.

After the steps shown in FIG. 2-3, the wafer is sliced along the axis 80 to create a plurality of sensor units. Then one of the sensor units is bonded to the circuit board 22 (FIG. 1) or a comparable device. In one embodiment, the separated individual sensor units are attached to the circuit board using gold beads, such as the beads 34 (FIG. 1), according to standard mechanical processing techniques. The gold beads attach to the traces 70, 72 at the angled wall of the vias 66, 68 where the separation along the axis 80 occurred.

FIG. 3 illustrates an exemplary accelerometer die 90 that includes an accelerometer located within a silicon layer 92 that is sandwiched between a first glass layer 94 and a second glass layer 96. A plurality of vias 100 has been etched into an exposed surface of the first glass layer 94. The vias 100 are etched all the way to the surface of the silicon layer 92 to expose electrical traces (not shown) located on the silicon layer 92. Smaller vias 102 are located at a base edge of the first and second glass layers 94, 96. The smaller vias 102 do not expose the surface of the silicon layer 92. A metallization pattern (e.g., electrical traces 104) is applied to the glass layers 94, 96 and into the vias 100, 102 and to any electrical lead located on the surface of the silicon layer 92. In order to attach the package 90 to a circuit board or a comparable device, metallic beads (not shown) are inserted into the smaller vias 102 and then temperature is increased and/or pressure is applied between the package 90 and a circuit board (not shown) in order to create a bond between the metallic beads, the circuit board, and the package 90.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A sensor die package comprising:
    a mechanical layer of silicon that is bonded to a first layer of glass, the mechanical layer comprising a sensor device;
    a second layer of glass attached to the mechanical layer of silicon;
    at least one first via in at least one of the first or second layers of glass configured to expose a predefined area on a surface of the mechanical layer of silicon;
    at least one second via in at least one of the first or second layers of glass, the at least one second via having a depth dimension that is less than a depth dimension of the at least one first via, wherein the at least one second via does not expose the mechanical layer of silicon and does not penetrate through the at least one of the first or second layers of glass in which the at least one second via is defined; and
    a metallic trace located between the exposed area on the mechanical layer of silicon and at least a portion of the at least one second via,
    wherein the at least one second via is open to an external surface of the at least one of the first or second layers of glass, the external surface facing away from the mechanical layer.

2. The package of claim 1, wherein the sensor device is hermetically sealed between the first or second layers of glass.

3. The package of claim 2, wherein the at least one sensor device comprises at least one of an accelerometer or a gyro.

4. The package of claim 1, wherein the predefined area on the surface of the mechanical layer of silicon exposed by the at least one first via includes an electrical trace that connects to the sensor device, and wherein the metallic trace electrically connects to the electrical trace.

5. The package of claim 1, wherein the at least one first via is defined by the first layer of glass and the at least one second via is defined by the second layer of glass.

6. The package of claim 1, wherein the at least one first via and the at least one second via are defined by the first layer of glass.

7. The package of claim 1, wherein the metallic trace extends between a bottom of the at least one second via and the predefined area on the surface of the mechanical layer of silicon, the bottom being defined by the at least one of the first or second layers of glass.

8. An accelerometer package comprising:
    a first sensor die comprising:
        a mechanical layer of silicon that is bonded to a first layer of glass, the mechanical layer comprising a sensor device;
        a second layer of glass attached to the mechanical layer of silicon;
        at least one first via in at least one of the first or second layers of glass configured to expose a predefined area on a surface of the mechanical layer of silicon;
        at least one second via in at least one of the first or second layers of glass, the at least one second via having a depth dimension that is less than a depth dimension of the at least one first via, wherein the at least one second via does not expose the mechanical layer of silicon and does not penetrate through the at least one of the first or second layers of glass in which the at least one second via is defined;
        a metallic trace located between the exposed area on the mechanical layer of silicon and at least a portion of the at least one second via,
        wherein the at least one second via is open to an external surface of the at least one of the first or second layers of glass, the external surface facing away from the mechanical layer;
    a circuit board;
    second and third sensor dies formed from a wafer used for creation of the first sensor die, wherein each of the second and third sensor dies comprises a sensor device; and
    a plurality of metallic beads configured to mechanically and electrically bond the first, second, and third dies to the circuit board such that sense axes for each of the sensor devices are perpendicular.

9. The package of claim 8, wherein the sensor devices are hermetically sealed between the first or second layers of glass.

10. The package of claim 8, wherein the sensor devices comprise at least one of accelerometers or gyros.

11. The package of claim 10, wherein the package comprises in-plane accelerometers configured to sense acceleration in three orthogonal axes.

12. The package of claim 8, wherein the predefined area on the surface of the mechanical layer of silicon exposed by the at least one first via includes an electrical trace that connects to the sensor device, and wherein the metallic trace electrically connects to the electrical trace.

13. The package of claim 8, wherein the at least one first via is defined by the first layer of glass and the at least one second via is defined by the second layer of glass.

14. The package of claim 8, wherein the at least one first via and the at least one second via are defined by the first layer of glass.

15. The package of claim 8, wherein the metallic trace extends between a bottom of the at least one second via and the predefined area on the surface of the mechanical layer of silicon, the bottom being defined by the at least one of the first or second layers of glass.

16. A method comprising:
    creating at least one sensor device in a mechanical layer of silicon that is bonded to a first layer of glass;
    attaching a second layer of glass to the mechanical layer of silicon to create a wafer;
    creating at least one first via in at least one of the first or second layers of glass to expose a predefined area on a surface of the mechanical layer of silicon;
    creating at least one second via in at least one of the first or second layers of glass, the at least one second via having a depth dimension that is less than a depth dimension of the at least one first via, wherein the at least one second via does not expose the mechanical layer of silicon and does not penetrate through the at least one of the first or second layers of glass in which the at least one second via is defined, and wherein the at least one second via is open to an external surface of the at least one of the first or second layers of glass, the external surface facing away from the mechanical layer; and
    applying a metallic trace between the exposed area on the mechanical layer of silicon and at least a portion of the at least one second via.

17. The method of claim 16, wherein the sensor device is hermetically sealed between the first or second layers of glass.

18. The method of claim 16, wherein the at least one sensor device comprises at least one of an accelerometer or a gyro.

\* \* \* \* \*